(12) United States Patent
Simmons (10) Patent No.: US 8,683,394 B2
(45) Date of Patent: Mar. 25, 2014

(54) PATTERN MATCHING OPTICAL PROXIMITY CORRECTION

(75) Inventor: Mark C Simmons, Wilsonville, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/363,348

(22) Filed: Jan. 31, 2012

(65) Prior Publication Data

US 2013/0198699 A1    Aug. 1, 2013

(51) Int. Cl.
*G06F 17/50* (2006.01)

(52) U.S. Cl.
USPC ............................................. 716/53

(58) Field of Classification Search
USPC ............................................. 716/53
See application file for complete search history.

(56) References Cited

U.S. PATENT DOCUMENTS

| | | | |
|---|---|---|---|
| 2005/0091634 A1* | 4/2005 | Gallatin et al. | 716/21 |
| 2006/0143589 A1* | 6/2006 | Horng et al. | 716/19 |
| 2006/0195808 A1* | 8/2006 | Keck | 716/8 |
| 2006/0246362 A1* | 11/2006 | Yasuzato | 430/5 |
| 2007/0050741 A1* | 3/2007 | Ogawa et al. | 716/5 |
| 2007/0074142 A1* | 3/2007 | Smayling et al. | 716/21 |
| 2007/0074146 A1* | 3/2007 | Tanaka et al. | 716/21 |
| 2007/0174807 A1* | 7/2007 | Kumashiro et al. | 716/21 |
| 2008/0148218 A1* | 6/2008 | Kawakami et al. | 716/21 |
| 2008/0189673 A1* | 8/2008 | Ying | 716/21 |
| 2009/0049420 A1* | 2/2009 | Kobayashi | 716/19 |
| 2010/0005440 A1* | 1/2010 | Viswanathan et al. | 716/19 |
| 2010/0107133 A1* | 4/2010 | Nakagawa et al. | 716/5 |
| 2012/0005635 A1* | 1/2012 | Lee et al. | 716/53 |
| 2012/0122023 A1* | 5/2012 | Hsu et al. | 430/5 |
| 2012/0284675 A1* | 11/2012 | Shiely et al. | 716/53 |

OTHER PUBLICATIONS

"Fast and Accurate OPC for Standard-Cell Layouts", by David M. Pawlowski, et al., Design Automation Conference, 2007. ASP-DAC '07. Asia and South Pacific, p. 7-12. IEEE, (2007).

* cited by examiner

*Primary Examiner* — Stacy Whitmore (57) ABSTRACT

Aspects of the invention relate to techniques for improving speed and consistency of OPC processes based on pattern matching. Pattern matching may be performed on a layout design to determine one or more arrays in the layout design that comprise arrays of identical layout patterns of which each matches a reference pattern. The one or more arrays may then be partitioned into core portions and boundary portions. The OPC process information for the reference pattern may be applied to the core portions, while a conventional OPC process may be performed on the boundary portions and layout regions outside of the one or more arrays.

19 Claims, 6 Drawing Sheets

Flow chart 400

Flow chart 400

PATTERN MATCHING OPTICAL PROXIMITY CORRECTION

FIELD OF THE INVENTION

The present invention relates to the field of lithography. Various implementations of the invention may be particularly useful for conducting optical proximity correction on layout designs with regular arrays of identical features.

BACKGROUND OF THE INVENTION

Electronic circuits, such as integrated circuits (ICs), are used in a variety of products, from automobiles to microwaves to personal computers. Designing and fabricating IC devices typically involves many steps, sometimes referred to as the "design flow." The particular steps of a design flow often are dependent upon the type of the circuit, its complexity, the design team, and the circuit fabricator or foundry that will manufacture the circuit. Typically, software and hardware "tools" verify the design at various stages of the design flow by running software simulators and/or hardware emulators. These steps aid in the discovery of errors in the design, and allow the designers and engineers to correct or otherwise improve the design.

Several steps are common to most design flows. Initially, the specification for a new circuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This device design generally corresponds to the level of representation displayed in conventional circuit diagrams. The relationships between the electronic devices are then analyzed, to confirm that the circuit described by the device design will correctly perform the desired functions. This analysis is sometimes referred to as "formal verification." Additionally, preliminary timing estimates for portions of the circuit are often made at this stage, using an assumed characteristic speed for each device, and incorporated into the verification process.

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. Typically, a designer will select groups of geometric elements representing IC components (e.g., contacts, channels, gates, etc.) and place them in a design area. These groups of geometric elements may be custom designed, selected from a library of previously-created designs, or some combination of both. Lines are then routed between the geometric elements, which will form the wiring used to interconnect the electronic devices. Layout tools (often referred to as "place and route" tools), such as Mentor Graphics' IC Station or Cadence's Virtuoso, are commonly used for both of these tasks.

Circuit layout descriptions can be provided in many different formats. The Graphic Data System II (GDSII) format is a popular format for transferring and archiving two-dimensional (2D) graphical circuit layout data. Among other features, it contains a hierarchy of structures, each structure containing layout elements (e.g., polygons, paths or polylines, circles and textboxes). Other formats include an open source format named Open Access, Milkyway by Synopsys, Inc., EDDM by Mentor Graphics, Inc., and the more recent Open Artwork System Interchange Standard (OASIS) proposed by Semiconductor Equipment and Materials International (SEMI). These various industry formats are used to define the geometrical information in design layouts that are employed to manufacture integrated circuits. Once the design is finalized, the layout portion of the design can be used by fabrication tools to manufacture the circuit using a photolithographic process.

There are many different fabrication processes for manufacturing a circuit, but most processes include a series of steps that deposit layers of different materials on a substrate, expose specific portions of each layer to radiation, and then etch the exposed (or non-exposed) portions of the layer away. For example, a simple semiconductor device component could be manufactured by the following steps. First, a positive type epitaxial layer is grown on a silicon substrate through chemical vapor deposition. Next, a nitride layer is deposited over the epitaxial layer. Then specific areas of the nitride layer are exposed to radiation, and the exposed areas are etched away, leaving behind exposed areas on the epitaxial layer, (i.e., areas no longer covered by the nitride layer). The exposed areas then are subjected to a diffusion or ion implantation process, causing dopants, for example phosphorus, to enter the exposed epitaxial layer and form charged wells. This process of depositing layers of material on the substrate or subsequent material layers, and then exposing specific patterns to radiation, etching, and dopants or other diffusion materials, is repeated a number of times, allowing the different physical layers of the circuit to be manufactured.

Each time that a layer of material is exposed to radiation, a mask must be created to expose only the desired areas to the radiation, and to protect the other areas from exposure. The mask is created from circuit layout data. That is, the geometric elements described in a design layout define the relative locations or areas of the circuit that will be exposed to radiation through the mask. A mask or reticle writing tool is used to create the mask based upon the design layout, after which the mask can be used in a photolithographic process.

As designers and manufacturers continue to increase the number of circuit components in a given area and/or shrink the size of circuit components, the shapes reproduced on the substrate (and thus the shapes in the mask) become smaller and are placed closer together. This reduction in feature size increases the difficulty of faithfully reproducing the image intended by the design layout onto the substrate. The diffractive effects of light often result in defects where the intended image is not accurately "printed" onto the substrate during the photolithographic process, creating flaws in the manufactured device. One or more resolution enhancement techniques (RETs) are often employed to improve the resolution of the image that the mask forms on the substrate during the photolithographic process. Examples of various resolution enhancement techniques are discussed in "Resolution Enhancement Technology: The Past, the Present, and Extensions for the Future," Frank M. Schellenberg, Optical Microlithography XVII, edited by Bruce W. Smith, Proceedings of SPIE Vol. 5377, which article is incorporated entirely herein by reference. One of these techniques, "optical proximity correction" or "optical process correction" (OPC), adjusts the amplitude of the light transmitted through a lithographic mask by modifying the design layout data employed to create the mask. For example, edges in the design layout may be adjusted to make certain portions of the geometric elements larger or smaller, in accordance with how much additional light exposure (or lack of exposure) is desired at certain points on the substrate. When these adjustments are appropriately calibrated, overall pattern fidelity is greatly improved.

OPC technologies may be classified into two broad categories, ruled based and model based. Most of the technology nodes currently in use demand correction accuracy that can be offered only by the model-based OPC. There are drawbacks, however, to using model-based OPC. One of the drawbacks is the large storage requirement for mask data and the large number of computation hours. A full-chip OPC process usually operates at a speed on the order of days per process layer. This problem will only get worse as electronic devices continue to have smaller and smaller features and electronic designs become more complex. Another drawback is the consistency problem suffered by current commercial OPC engines due to the nature of the algorithms being used. For example, a layout design is usually divided into small sections (sometimes referred to as "titles"). An OPC engine works on each of the sections separately and then stitch them together to form a final OPC result. The method for dividing the layout design and the sequence of the sections being operated on can both affect the final OPC result. This is particularly problematic for a circuit with an array of identical components. With technologies advancing, many process layers of a layout design are becoming more and more regular in their design structure. It is not uncommon for a design to contain large memory blocks that span up to 80% of the total chip area. A memory block usually contains an array of identical memory cells. It is desirable to search for methods that can speed up the OPC process and solve the consistency problem.

BRIEF SUMMARY OF THE INVENTION

Aspects of the invention relate to techniques for improving speed and consistency of OPC processes based on pattern matching. With various implementations of the invention, pattern matching is performed on a layout design to determine one or more matching pattern arrays in the layout design. Each of the one or more matching pattern arrays comprises an array of identical layout patterns of which each matches a reference pattern. The one or more matching pattern arrays may then be partitioned into core portions and boundary portions. The OPC process information for the reference pattern is applied to the core portions to derive core portion OPC process information. With some implementations of the invention, a conventional OPC process may be performed on the boundary portions and layout regions outside of the one or more matching pattern arrays to derive rest OPC process information. With some other implementations of the invention, the rest OPC process information may be determined by performing a conventional OPC process only on the layout regions outside of the one or more matching pattern arrays in the boundary portions are not for functional uses.

DETAILED DESCRIPTION OF THE INVENTION

General Considerations

Various aspects of the present invention relate to applying pattern matching techniques to OPC processes. In the following description, numerous details are set forth for the purpose of explanation. However, one of ordinary skill in the art will realize that the invention may be practiced without the use of these specific details. In other instances, well-known features have not been described in details to avoid obscuring the present invention.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "partition," "derive" and "determine" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

Exemplary Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the invention.

Figure 1:
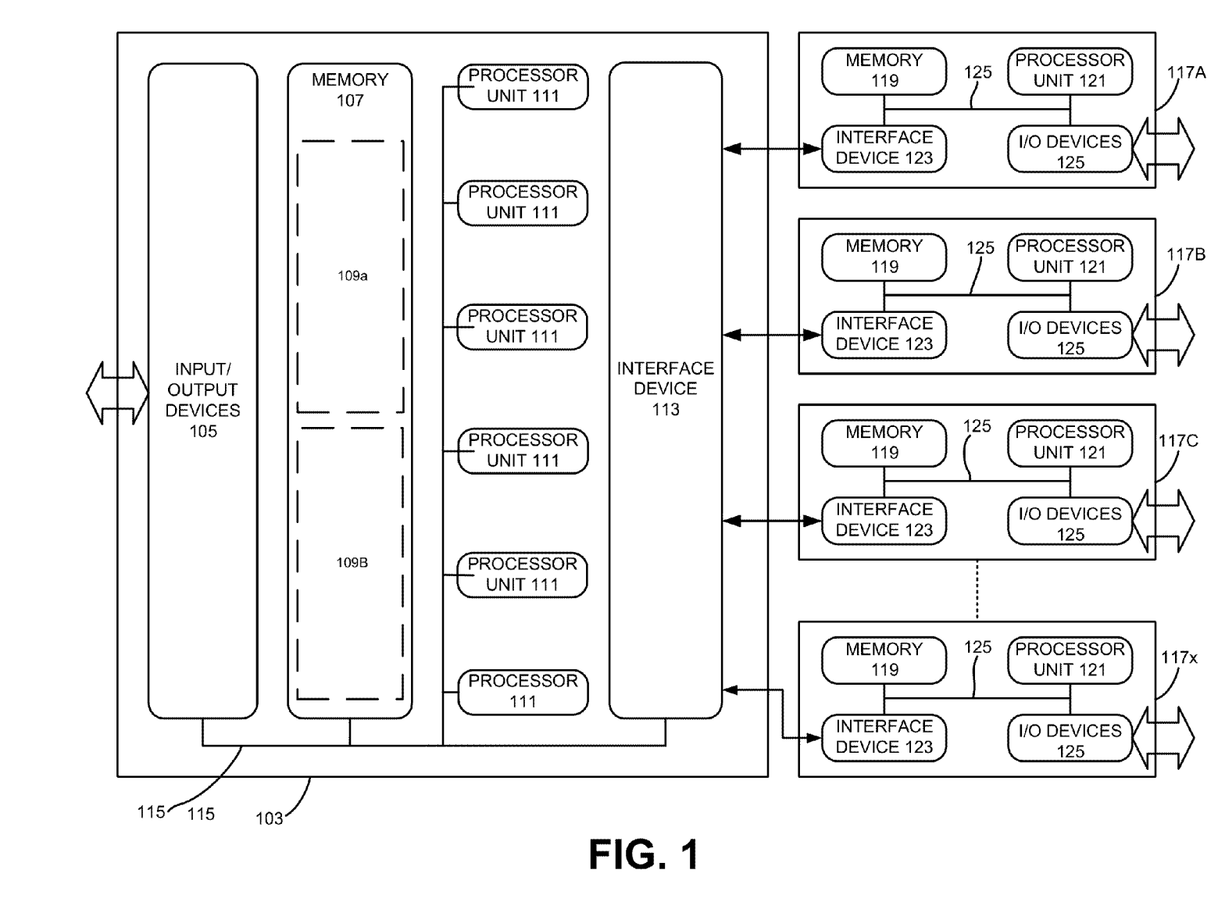
FIG. 1 illustrates an example of a computing system that may be used to implement various embodiments of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
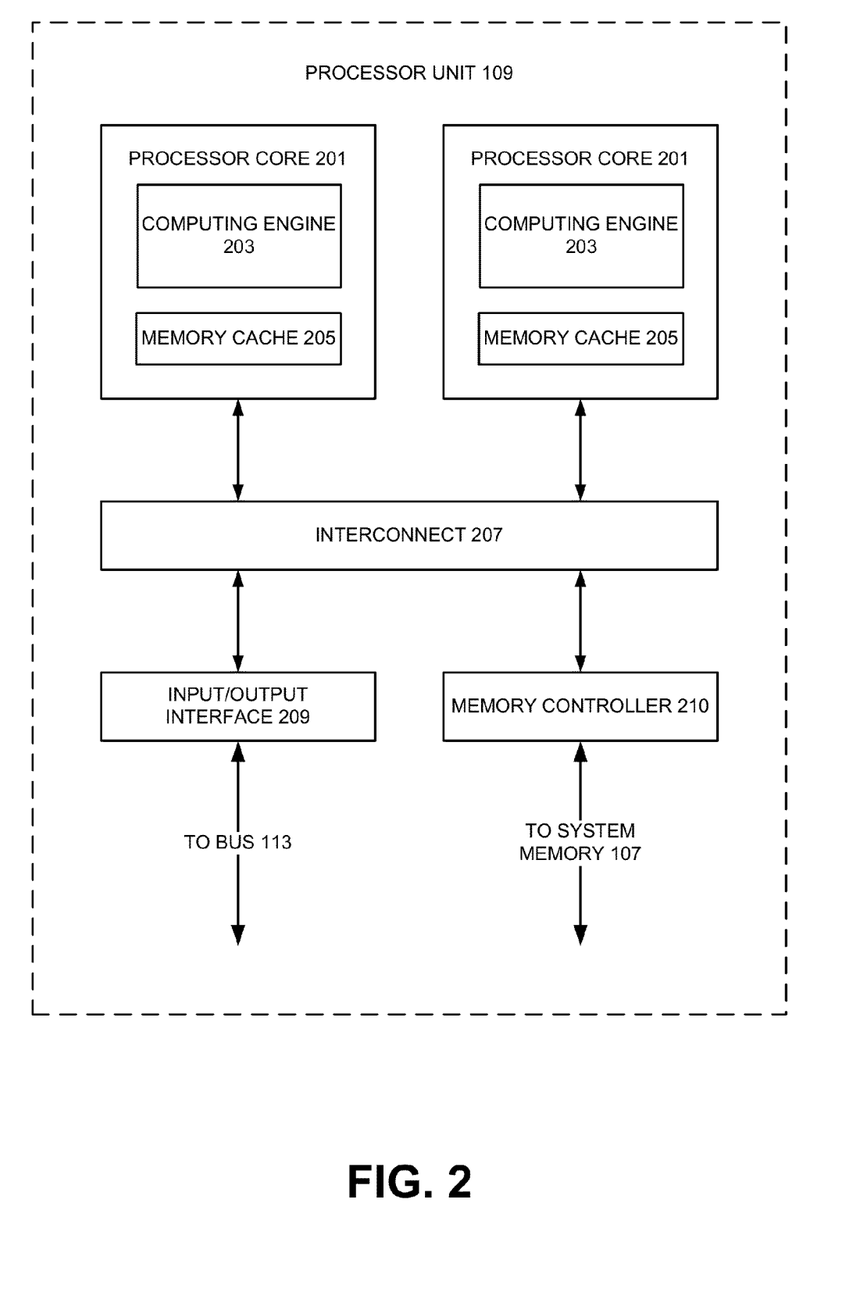
FIG. 2 illustrates an example of a multi-core processor unit that may be used to implement various embodiments of the invention.

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 115. Similarly, the memory controller 211 controls the exchange of information between the processor unit 201 and the system memory 107. With some implementations of the invention, the processor units 201 may include additional components, such as a high-level cache memory accessible shared by the processor cores 201.

While FIG. 2 shows one illustration of a processor unit 201 that may be employed by some embodiments of the invention, it should be appreciated that this illustration is representative only, and is not intended to be limiting. For example, some embodiments of the invention may employ a master computer 103 with one or more Cell processors. The Cell processor employs multiple input/output interfaces 209 and multiple memory controllers 211. Also, the Cell processor has nine different processor cores 201 of different types. More particularly, it has six or more synergistic processor elements (SPEs) and a power processor element (PPE). Each synergistic processor element has a vector-type computing engine 203 with 428×428 bit registers, four single-precision floating point computational units, four integer computational units, and a 556 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one or more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the invention may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the invention, either the computer 103, one or more of the servant computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the invention.

Pattern Matching OPC Tools and Methods

Figure 3:
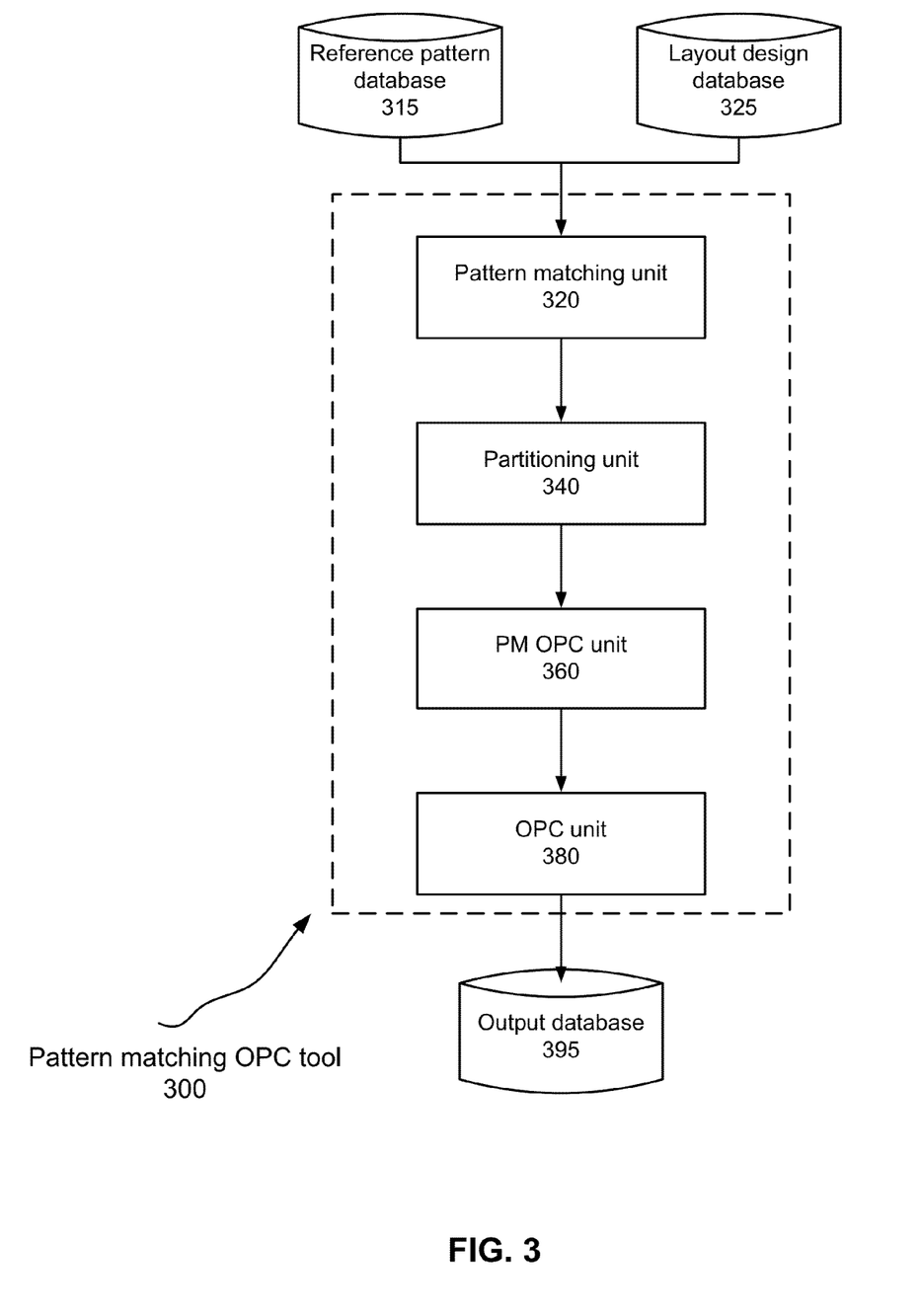
FIG. 3 illustrates a pattern matching OPC tool that may be employed according to various embodiments of the invention.

FIG. 3 illustrates an example of a pattern matching OPC tool according to various embodiments of the invention. As seen in the figure, the pattern matching OPC tool 300 includes four units: a pattern matching unit 320, a partitioning unit 340, a PM (pattern matching) OPC unit 360, and an OPC unit 380. As will be discussed in more detail below, some implementations of the pattern matching hints tool 300 may cooperate with (or incorporate) one or more of a reference pattern database 315, a layout design database 325, and an output database 395. While the reference pattern database 315, the layout design database 325, and the output database 395 are shown as separate units in FIG. 3, a single data storage medium may be used to implement some or all of these databases.

According to some embodiments of the invention, one or more of the pattern matching unit 320, the partitioning unit 340, the PM OPC unit 360, and the OPC unit 380 may be implemented by executing programming instructions on one or more programmable computers/computer systems, such as the computing system illustrated in FIG. 1 and FIG. 2. Correspondingly, some other embodiments of the invention may be implemented by software instructions, stored on a non-transitory computer-readable medium, for instructing one or more programmable computers/computer systems to perform the functions of one or more of the pattern matching unit 320, the partitioning unit 340, the PM OPC unit 360, and the OPC unit 380. As used herein, the term "non-transitory computer-readable medium" refers to computer-readable medium that are capable of storing data for future retrieval, and not just propagating electro-magnetic waves. The non-transitory computer-readable medium may be, for example, a magnetic storage device, an optical storage device, a "punched" surface type device, or a solid state storage device.

Figure 4:
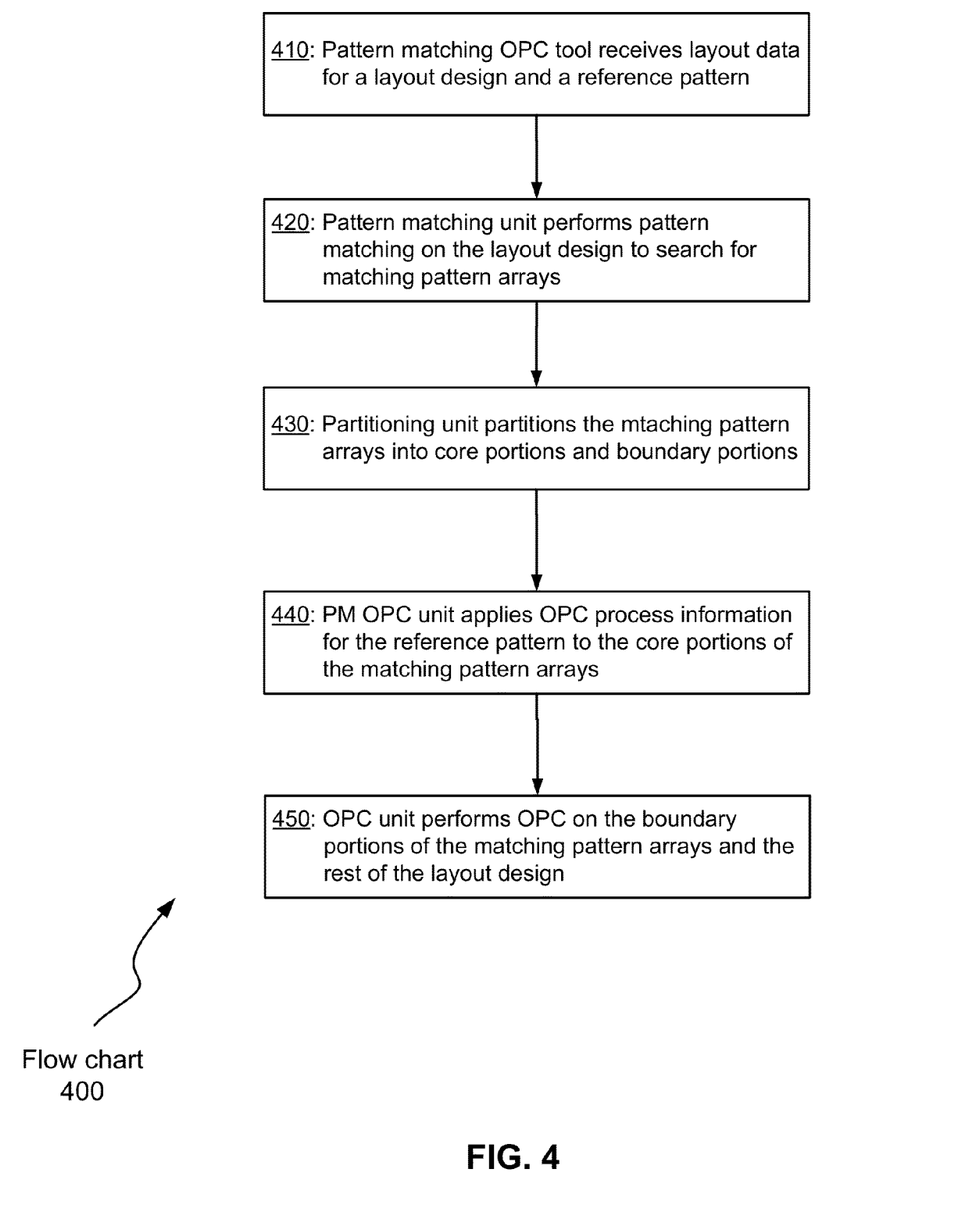
FIG. 4 illustrates a flowchart describing pattern matching OPC methods that may be employed by various embodiments of the invention.

For ease of understanding, pattern matching OPC methods that may be employed according to various embodiments of the invention will be described with reference to the pattern matching OPC tool 300 illustrated in FIG. 3 and the method for pattern matching OPC shown in the flow chart 400 in FIG. 4. It should be appreciated, however, that alternate implementations of a pattern matching OPC tool may be used to perform the pattern matching hints method shown in the flow chart 400 according to various embodiments of the invention. In addition, it should be appreciated that implementations of the pattern matching OPC tool 300 may be employed with other methods for pattern matching OPC according to different embodiments of the invention.

Figure 5:
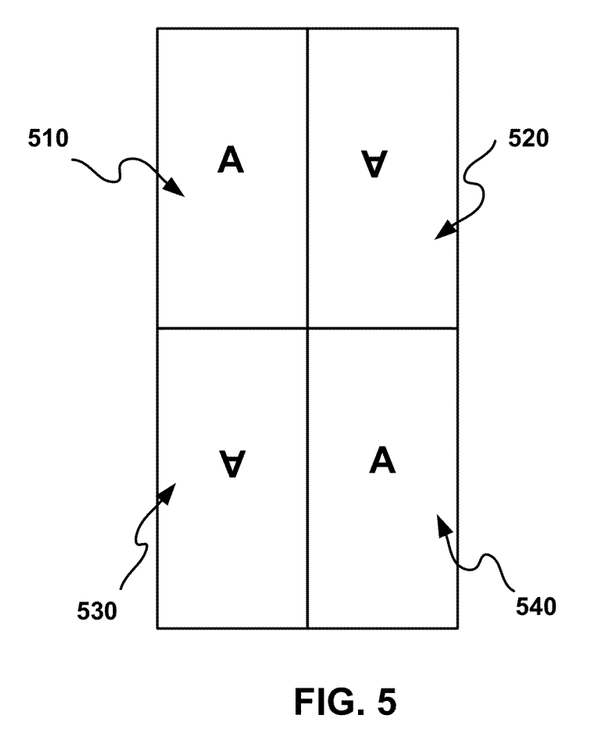
FIG. 5 illustrates an example of a reference pattern that is formed by a group of cells.

Initially, in operation 410, the pattern matching OPC tool 300 receives layout data for a layout design and information for a reference pattern. The information for the reference pattern may comprise pre-OPC layout data for the reference pattern and OPC process information for the reference pattern. The reference pattern may be a layout pattern comprising a single cell (such as a memory cell) or a group of cells. FIG. 5 illustrates an example of a group of cells. In the figure, four identical cells 510, 520, 530 and 540 form the group of cells. Cells 510 and 540 have the same orientation opposite to the orientation of cells 520 and 530. The group of cells forming a reference pattern may comprise structures different from that shown FIG. 5 and may also contain different cells. One factor for selecting a reference pattern may be whether the reference pattern appears as one or more arrays in the layout design. The OPC process information for the reference pattern may be obtained using a commercial OPC tool such as those in the Calibre family available from Mentor Graphics Corporation of Wilsonville, Oreg. The commercial OPC tool may be applied to the reference pattern assuming the reference pattern is surrounded by the same reference patterns. The Information of the reference pattern may be stored the reference pattern database 315 while the layout data for the layout design may be stored in the layout design database 325.

In operation 420, the pattern matching unit 320 performs pattern matching on the layout design to search for matching pattern arrays. Each of the matching pattern arrays comprises an array of identical layout patterns of which each matches the reference pattern. Again, any commercial tool for pattern matching such as those in the Calibre family available from Mentor Graphics Corporation of Wilsonville, Oreg. may be incorporated by the pattern matching unit 320 to perform this operation.

In operation 430, the partitioning unit 340 partitions the matching pattern arrays into core portions and boundary portions. During an OPC operation on an edge segment, layout features inside a certain distance from the edge segment need to be considered. This distance is sometimes called as the radius of influence, approximately 600 nm for a 193 nm wavelength illumination source. One objective for the partitioning operation 430 may be to determine areas in the matching pattern arrays where the OPC process information for the reference pattern may be applied without considering layout features outside the matching pattern arrays. Accordingly, the partitioning unit 340 may use the radius of influence as a factor in determining the core portions.

In operation 440, the PM OPC unit 360 applies the OPC process information for the reference pattern to the core portions of the matching pattern arrays to derive OPC process information for the core portions. This step helps to speed up the whole OPC process and to improve OPC results by solving the inconsistency problem.

Figure 6A:
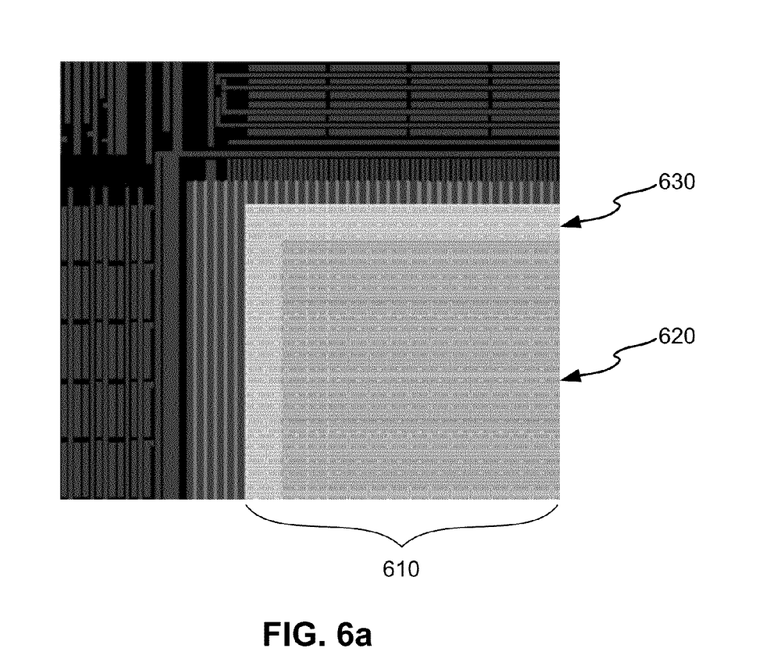
FIG. 6a illustrates a part of a layout design in which a regular array of cells is partitioned into two portions according to various embodiments of the invention.

In operation 450, the OPC unit 380 performs OPC on the boundary portions of the matching pattern arrays and rest regions of the layout design. FIG. 6a illustrates a portion of a layout design. The layout portion includes a part of a cell array 610. The array is partitioned into two portions, a core portion 620 and a boundary portion 630. The PM OPC unit 360 may operate on the core portion 620 while the OPC unit 450 may work on the boundary portion and the rest of the design. The OPC process information for the core portions may be used, especially for layout features that are close to the core portion 620. Any commercial OPC tool such as those in the Calibre family available from Mentor Graphics Corporation of Wilsonville, Oreg. may be incorporated by the OPC unit 380 to perform the OPC process.

Figure 6B:
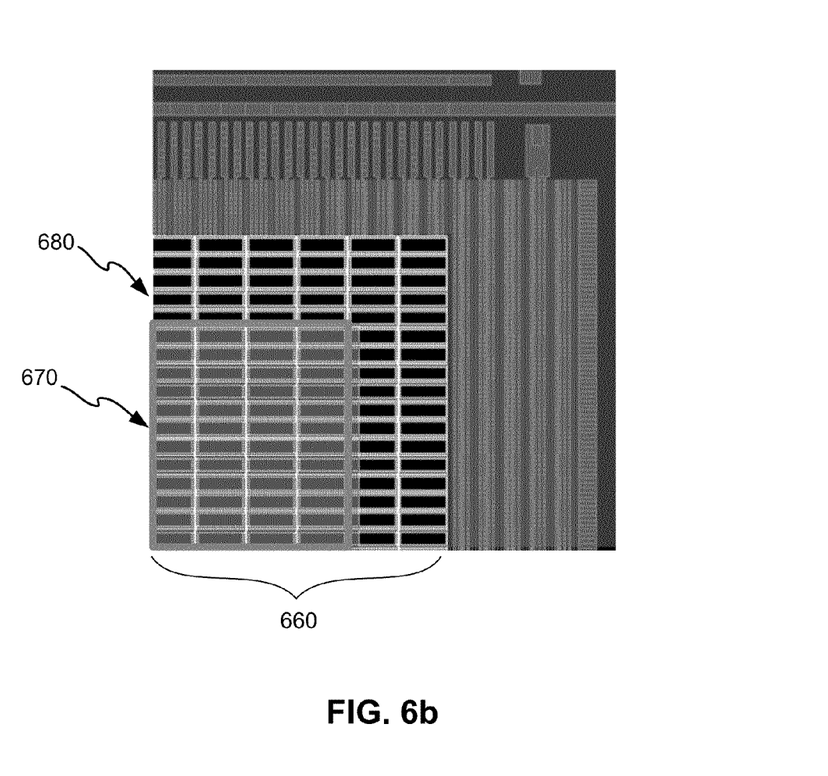
FIG. 6b illustrates a part of another layout design in which a regular array of cells is partitioned into two portions according to various embodiments of the invention, wherein the cells in the boundary portion are not for functional uses.

In some designs, memory cells at the boundary are not intended for functional uses. Accordingly, the OPC unit 380 may focus on regions of the design that do not belong to the matching pattern arrays. FIG. 6b illustrates such an example. Like the circuit design shown in FIG. 6a, only a part of an array of cells 660 is shown. This array is also partitioned into two portions, a core portion 670 and a boundary portion 680. Unlike FIG. 6a, however, cells in the boundary portion 680 are not for functional uses and thus are not treated the same as the regions outside the matching pattern arrays by the OPC unit 380.

In some other designs, there may be one or more additional arrays formed by a different reference pattern. The operations 420, 430 and 440 may be repeated for the one or more additional arrays.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. A method of pattern matching optical proximity correction, comprising:
receiving layout data for a layout design and layout information for a reference pattern, the layout information for the reference pattern comprising pre-OPC layout data for the reference pattern and first OPC (optical proximity correction) process information for the reference pattern;
performing, with one or more programmable computing devices, pattern matching on the layout design to determine one or more matching pattern arrays in the layout design, each of the one or more matching pattern arrays comprising an array of identical layout patterns of which each matches the reference pattern;
partitioning the one or more matching pattern arrays into core portions and boundary portions; and
applying the first OPC process information for the reference pattern to the core portions to derive second OPC process information.

2. The method recited in claim 1, further comprising:
performing OPC on regions of the layout design that do not belong to the one or more matching pattern arrays to derive third OPC process information.

3. The method recited in claim 1, further comprising:
performing OPC on the boundary portions and regions of the layout design that do not belong to the one or more matching pattern arrays to derive third OPC process information.

4. The method recited in claim 1, wherein the reference pattern comprises a cell.

5. The method recited in claim 4, wherein the cell is a memory cell.

6. The method recited in claim 1, wherein the reference pattern comprises a group of cells.

7. The method recited in claim 1, wherein the partitioning is based on radius of influence.

8. A non-transitory processor-readable medium storing processor-executable instructions for causing one or more processors to perform a method of pattern matching optical proximity correction, the method comprising:

receiving layout data for a layout design and layout information for a reference pattern, the layout information for the reference pattern comprising pre-OPC layout data for the reference pattern and first OPC (optical proximity correction) process information for the reference pattern;

performing pattern matching on the layout design to determine one or more matching pattern arrays in the layout design, each of the one or more matching pattern arrays comprising an array of identical layout patterns of which each matches the reference pattern;

partitioning the one or more matching pattern arrays into core portions and boundary portions; and applying the first OPC process information for the reference pattern to the core portions to derive second OPC process information.

9. The non-transitory processor-readable medium recited in claim 8, wherein the method further comprising:

performing OPC on regions of the layout design that do not belong to the one or more matching pattern arrays to derive third OPC process information.

10. The non-transitory processor-readable medium recited in claim 8, wherein the method further comprising:

performing OPC on the boundary portions and regions of the layout design that do not belong to the one or more matching pattern arrays to derive third OPC process information.

11. The non-transitory processor-readable medium recited in claim 8, wherein the reference pattern comprises a cell.

12. The non-transitory processor-readable medium recited in claim 8, wherein the reference pattern comprises a group of cells.

13. The non-transitory processor-readable medium recited in claim 8, wherein the partitioning is based on radius of influence.

14. A system comprising one or more processors, the one or more processors programmed to perform a method of pattern matching optical proximity correction, the method comprising:

receiving layout data for a layout design and layout information for a reference pattern, the layout information for the reference pattern comprising pre-OPC layout data for the reference pattern and first OPC (optical proximity correction) process information for the reference pattern;

performing pattern matching on the layout design to determine one or more matching pattern arrays in the layout design, each of the one or more matching pattern arrays comprising an array of identical layout patterns of which each matches the reference pattern;

partitioning the one or more matching pattern arrays into core portions and boundary portions; and applying the first OPC process information for the reference pattern to the core portions to derive second OPC process information.

15. The system recited in claim 14, wherein the method further comprising:

performing OPC on regions of the layout design that do not belong to the one or more matching pattern arrays to derive third OPC process information.

16. The system recited in claim 14, wherein the method further comprising:

performing OPC on the boundary portions and regions of the layout design that do not belong to the one or more matching pattern arrays to derive third OPC process information.

17. The system recited in claim 14, wherein the reference pattern comprises a cell.

18. The system recited in claim 14, wherein the reference pattern comprises a group of cells.

19. The system recited in claim 14, wherein the partitioning is based on radius of influence.

* * * * *